United States Patent [19]

Dardi et al.

[11] 4,339,509
[45] Jul. 13, 1982

[54] SUPERALLOY COATING COMPOSITION WITH OXIDATION AND/OR SULFIDATION RESISTANCE

[75] Inventors: Louis E. Dardi; Srinivasan Shankar, both of Muskegon, Mich.

[73] Assignee: Howmet Turbine Components Corporation, Greenwich, Conn.

[21] Appl. No.: 145,460

[22] Filed: May 1, 1980

Related U.S. Application Data

[63] Continuation-in-part of Ser. No. 67,097, Aug. 16, 1979, Pat. No. 4,313,760, which is a continuation-in-part of Ser. No. 43,146, May 29, 1979, abandoned.

[51] Int. Cl.$^3$ .................................................. B32B 15/04
[52] U.S. Cl. .......................................... 428/632; 428/639; 428/637; 428/668; 428/678; 428/680; 428/926; 428/937
[58] Field of Search ............................ 428/678–685, 428/629, 632, 633, 639, 937, 926, 637, 668

[56] References Cited

U.S. PATENT DOCUMENTS

| | | | |
|---|---|---|---|
| Re. 29,920 | 2/1979 | Baldwin | 75/134 F |
| 3,676,085 | 7/1972 | Evans et al. | 428/678 |
| 3,849,865 | 11/1974 | Gedwill et al. | 29/460 |
| 3,869,779 | 3/1975 | Gedwill et al. | 29/194 |
| 3,928,026 | 12/1975 | Heckt et al. | 428/678 |
| 3,957,454 | 5/1976 | Bessen | 428/667 |
| 4,005,989 | 2/1977 | Preston | 29/194 |
| 4,013,424 | 3/1977 | Wildgoose et al. | 75/171 |
| 4,022,587 | 5/1977 | Wlodek | 428/678 |
| 4,061,495 | 12/1977 | Selman et al. | 75/134 F |
| 4,078,922 | 3/1978 | Magyar et al. | 75/134 F |
| 4,088,479 | 5/1978 | Spengler | 75/171 |
| 4,101,715 | 7/1978 | Rairden | 428/652 |
| 4,111,685 | 9/1978 | Baranow | 75/134 F |
| 4,145,481 | 3/1979 | Gupta et al. | 428/678 |
| 4,152,488 | 5/1979 | Schulke et al. | 75/171 |
| 4,169,726 | 10/1979 | Fairbanks | 75/134 F |
| 4,219,592 | 8/1980 | Anderson et al. | 428/679 |
| 4,312,682 | 1/1982 | Herchenroeder | 148/31.5 |

FOREIGN PATENT DOCUMENTS

| | | |
|---|---|---|
| 1029609 | 5/1966 | United Kingdom . |
| 1143035 | 2/1969 | United Kingdom . |
| 1151178 | 5/1969 | United Kingdom . |
| 1182100 | 2/1970 | United Kingdom . |
| 1206666 | 9/1970 | United Kingdom . |
| 1250382 | 10/1971 | United Kingdom . |
| 1262588 | 2/1972 | United Kingdom . |
| 1270218 | 4/1972 | United Kingdom . |
| 1302934 | 7/1973 | United Kingdom . |
| 1332159 | 10/1973 | United Kingdom . |
| 1361588 | 7/1974 | United Kingdom . |
| 1362629 | 8/1974 | United Kingdom . |
| 1408373 | 10/1975 | United Kingdom . |
| 1472170 | 5/1977 | United Kingdom . |
| 1473134 | 5/1977 | United Kingdom . |
| 1512984 | 6/1978 | United Kingdom . |
| 1559711 | 1/1980 | United Kingdom . |

*Primary Examiner*—Michael L. Lewis
*Attorney, Agent, or Firm*—Finnegan, Henderson, Farabow, Garrett & Dunner

[57] ABSTRACT

Coatings for iron-, nickel- and cobalt-base superalloys. The coatings are applied in order to provide good oxidation and/or sulfidation and thermal fatigue resistance for the substrates to which the coatings are applied. The coatings consist essentially of, by weight, 10 to 50% chromium, 3 to 15% aluminum, 0.1 to 10% manganese, up to 8% tantalum, up to 5% tungsten, up to 5% reactive metal from the group consisting of lanthanum, yttrium and other rare earth elements, up to 5 percent of rare earth and/or refractory metal oxide particles, up to 12% silicon, up to 10% hafnium, and the balance selected from the group consisting of nickel, cobalt and iron, and combinations thereof. Additions of titanium up to 5% and noble metals up to 15% are also contemplated.

16 Claims, 4 Drawing Figures

SUPERALLOY COATING COMPOSITION WITH OXIDATION AND/OR SULFIDATION RESISTANCE

RELATED APPLICATION

This application is a continuation-in-part of applicants' copending application Ser. No. 67,097, filed Aug. 16, 1979, now U.S. Pat. No. 4,313,769 and entitled "Superalloy Coating Composition", which is a continuation-in-part of application Ser. No. 43,146, filed May 29, 1979, now abandoned, and entitled "High Temperature Oxidation and Sulfidation Resistant Coating".

BACKGROUND OF THE INVENTION

This invention is concerned with coatings adapted to significantly improve the elevated temperature corrosion resistance of articles composed of iron-, cobalt- or nickel-based superalloys whereby more satisfactory performance and longer life for such articles can be obtained.

Elevated temperature exposure of metal articles is experienced in many situations. Metal components are subjected to such conditions, for example, in various aerospace applications and in land and marine operations such as in the case of blades, vanes, seals and other components utilized in gas turbine engines.

In such applications, it is important to provide some means for preventing undue oxidation/sulfidation of the components involved since such corrosion can materially shorten the useful life of the components. Deterioration of components can also create significant performance and safety problems.

Various alloys, including most superalloys, are characterized by a degree of corrosion resistance, however, such resistance is significantly decreased when unprotected superalloy components are exposed at the operating temperatures involved in certain systems. For that reason, such components have been provided with coatings, such as aluminide coatings, which increase the corrosion resistance at elevated operating temperatures.

Aluminide coatings are applied by methods such as the pack cementation process. In this process, the substrate chemistry and the processing temperature exert a major influence on coating chemistry, thickness and properties. Specifically, the coatings comprise a hard, brittle outer layer and a hard, brittle multi-phase sublayer that can crack when subjected to mechanically or thermally induced strain. This leads to poor fatigue properties, and the cracks can also materially reduce the corrosion resistance of the coated components.

Another class of coatings is the MCrAlY overlay coatings where M stands for a transition metal element such as iron, cobalt or nickel. MCrAlY coatings have been shown to have an advantage over aluminide coatings in providing extended life to turbine components. Specifically, MCrAlY coatings generally demonstrate greater corrosion resistance than aluminide coatings and also greatly superior ductility.

Presently, these MCrAlY coatings are applied by vacuum physical vapor deposition. However, the fundamental nature of the vacuum physical vapor deposition process limits the composition of the coating that can be applied to an article. Specifically, with a single multi-element source, it is very difficult to deposit MCrAlY type coatings which contain other elements that haveeither very low or very high vapor pressures. Resorting to dual or multiple sources introduces a further degree of complexity to an already complex process which is undesirable from a production standpoint.

Another technique of applying MCrAlY coatings is plasma spraying. In plasma spraying, the heated alloy particles corresponding to the desired coating composition are impinged on the preheated surface of the metal article at very high velocity and temperature. Such particles, upon contact with the metal article surface or with other applied particles, deform plastically and fuse and bond to the surface or to the other applied particles, thus producing a dense and adherent coating. Plasma spraying is particularly desirable since it is a generally less costly technique for producing the overlay coating and is not restricted by vapor pressure limitations as in the case with the vacuum physical vapor deposition processes.

Other attempts at improving elevated temperature corrosion resistance are described in U.S. Pat. No. 4,145,481, issued on Mar. 20, 1979. This process involves the location of a MCrAlY coating over a substrate to provide an overlay, and an aluminide coating was then added as an outer layer. This technique attempts to achieve the advantages of the ductility of the MCrAlY and the resistance to elevated temperature corrosion of the aluminide. Copending application Ser. No. 847,253, filed on Oct. 31, 1977, takes the approach of utilizing first and second MCrAlY-type coatings on a substrate. A first coating is intended to provide a ductile layer with the second coating providing a layer having a greater resistance to elevated temperature corrosion.

Still other approaches, particularly from the standpoint of alloying ingredients and application techniques are described in the following U.S. Pat. Nos.:

| Inventor | U.S. Pat. No. | Date Of Issue |
| --- | --- | --- |
| Gedwill, et al. | 3,849,865 | Nov. 26, 1974 |
| Gedwill, et al. | 3,869,779 | Mar. 11, 1975 |
| Hecht, et al. | 3,928,026 | Dec. 23, 1975 |
| Bessen | 3,957,454 | May 18, 1976 |
| Preston | 4,005,989 | Feb. 1, 1977 |

In view of the fact that increasingly greater demands are placed on performance, particularly for components subject to extreme temperature conditions, it is desirable to provide even greater improvements in the capabilities of coatings of the type described. The demand for requisite ductility while maintaining resistance to the corrosive effects of temperature and atmosphere is particularly critical.

Oxidation-sulfidation resistance and thermal fatigue resistance at temperatures above 1400° F. is of great importance. Coatings suited for metal components which are subjected to a relatively low temperature (less than 1400° F.) corrosive environment are, however, also of great value.

The low temperature corrosive environment, in particular, refers to the conditions that exist in liquid-fueled turbines burning fuel high in sulfur and vanadium content and operating in a marine environment. Substantial sulfidation (hot corrosion) has been observed in these types of engines, especially when they are operated at low power settings (low temperature). $SO_3$ has been identified as an agent that can be responsible for this type of attack.

In such applications, it is important to provide some means of preventing the catastrophic corrosion since such corrosion can materially shorten the useful life of the components. Deterioration of components can also create significant performance and safety problems.

Some attempts have been made to develop coating compositions to combat the problem of "low temperature" corrosion occurring below 1400° F. The following U.S. patents describe compositions and application techniques which might be used for this application:

| U.S. Pat. No. | Date of Issue | Patentee |
| --- | --- | --- |
| 4,022,587 | May 10, 1977 | Wlodek |
| 4,088,479 | May 9, 1978 | Spengler |
| 4,101,715 | July 18, 1978 | Rairden |

These compositions are simply MCrAlY coatings. In view of the energy shortage, resulting in gas turbine engines burning "dirty" fuel containing large amounts of sulfur and vanadium, it is desirable to provide even greater improvements in the capabilities of coatings to provide corrosion resistance at temperatures below approximately 1400° F.

SUMMARY OF THE INVENTION

The coating compositions of this invention are particularly resistant to oxidation and/or sulfidation at elevated temperatures, are otherwise highly efficient in their performance at these temperatures, and are well suited for application to substrates by plasma spraying. In the broadest sense, the coatings consist essentially of, by weight, from 10 to 50% chromium, 3 to 15% aluminum, 0.1 to 10% manganese, up to 8% tantalum, up to 5% tungsten, up to about 12% silicon, up to about 10% hafnium, and the balance selected from the group consisting of nickel, cobalt and iron and combinations thereof.

Optionally, the coating may have up to 5% by weight reactive metal from the group consisting of lanthanum, yttrium and the other rare earths. Also the addition of rare earth and/or refractory metal oxide particles to the aforementioned coating composition is contemplated; these ingredients preferably being individually utilized in amounts from about 0.05 up to about 2.0% by weight. Such additions can be beneficial to the over-all protective response of the coating because the metal oxide particles assist in pinning protective oxide scales. This pinning phenomenon results in superior adherence (less spalling) of the protective scale, thus increasing the over-all coating life. Additions of titanium up to about 5% and of noble metals up to about 15% are also contemplated.

It will be appreciated that in using the term "coating", reference to application of material to a substrate surface is generally intended. Use of the material as an abradable sealing material is, for example, contemplated.

DESCRIPTION OF THE PREFERRED EMBODIMENTS

Figure 1:
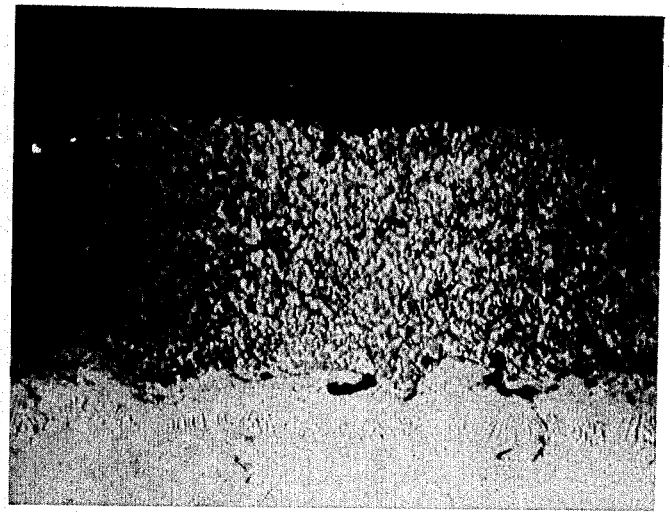
FIG. 1 comprises a 500X magnification of the microstructure of a coating and substrate particularly suited for performance at high temperatures.

As set forth in the foregoing summary, the invention relates to a coating composition for superalloy substrates. Protection against oxidation at very high temperatures (in the order of 1400° F. and higher) is particularly important, and a coating particularly suited to this includes, by weight, 10 to 35% chromium and 5 to 15% aluminum, with the balance nickel, cobalt or iron, or combinations thereof. A nickel base alloy coating composition containing from 5 to 35% cobalt is, for example, contemplated. Another example of this basic combination consists of a cobalt base alloy coating composition containing from 15 to 40% chromium and 3 to 13% aluminum.

It is also contemplated that a metal mixture be utilized in the coatings, this consisting of tantalum, tungsten and manganese and combinations thereof, and the balance nickel. The mixture may be present in amounts from 1 to 15%, and tantalum should then represent at least one-fifth by weight of the mixture, or at least 0.5 of the total coating weight, whichever is greater. The balance of the mixture consists of at least 0.5% manganese or tungsten, or combinations thereof. Optional additions of silicon up to 12% by weight and of hafnium up to 10% by weight are also contemplated.

It has also been determined that the provision of manganese in amounts from 0.1 to 10% by weight, preferably 1 to 4% by weight, will impart excellent sulfidation resistance even in the absence of tantalum and/or tungsten. Additions of tantalum up to 8% by weight and tungsten up to 5% by weight are then contemplated particularly where oxidation resistance is required. In the case of the cobalt base alloy composition mentioned above, the tantalum is preferably present in amounts up to 5% by weight and the tungsten up to 2% by weight. The above mentioned additions of silicon and hafnium are also considerations for any of the compositions within the ranges described.

The various coatings described may include alloying elements for various purposes, for example up to 5% reactive metal consisting of lanthanum, yttrium and the other rare earths. In the preferred form of the invention, these elements are utilized in an amount between 1.0 to 3.0% by weight of the coating composition.

Rare earth or refractory metal oxide particles in amounts beneficial to the over-all protective aspects of the coating are also contemplated because they assist relative to the pinning phenomenon. As indicated, these additions are preferably in the range of 0.05 to 2.0% by weight.

A similar improvement in the coating life can be achieved by the addition of up to about 15 weight percent of a noble metal selected from the group consisting of platinum, rhodium or palladium. An addition of this type also improves the diffusional stability of the coating.

Where the aforementioned metal mixture makes up a portion of the coating composition, it is generally preferred that the mixture contain between 2 and 5% tantalum along with between 2 and 5% of material comprising tungsten, manganese or a combination thereof. It has been found, however, that the amount of tungsten preferably does not exceed 1.5% by weight. The other ingredients of the coating composition of this type are preferably employed within the limits of, by weight, 10 to 20% cobalt, 15 to 25% chromium, 10 to 14% aluminum, up to about 2% silicon, and up to about 5% hafnium.

It is contemplated that the coating composition of this invention form the corrosion resistant outer layer of the two layer MCrAlY coating described in the aforementioned patent application Ser. No. 847,253.

The composition may also form the inner layer or the bond coat for a two-layer or graded thermal barrier coating which is used to reduce metal operating temperatures and the effects of thermal transients in gas turbine engines. In such applications, the bond coat must be similar to the substrate, and the composition of the ceramic/metallic two layer or graded coating system must be such that stresses caused by thermal expansion mismatch between the bond coat and the compatible oxide outer layer are minimized. In addition, the inner layer must be fairly dense and the surface of this undercoat must be rough enough to provide an adherent surface for the oxide overcoat. Plasma sprayed compositions satisfy these requirements, and hence, are ideally suited for this application.

As noted, the above narrower composition ranges are best suited for higher temperatures although compositions within the broader ranges have utility at such temperatures. With reference to compositions suited for the coating of superalloy substrates where operating temperatures are less than about 1400° F., the broader ranges for percentages of ingredients are recommended. Specifically, higher chromium content is desirable in certain instances with from 10 to 50% by weight chromium being an appropriate range. On the other hand, lower percentages of aluminum can be utilized and, therefore, an aluminum range from 3 to 15% is appropriate. Finally, titanium in amounts up to about 5% by weight is desirably included, while silicon in amounts from 5 to 8% by weight is contemplated.

The chromium content can, however, be reduced when the manganese is used in the higher percentages mentioned. Thus, the manganese is useful in amounts up to 10% by weight for this additional purpose.

The intermediate temperature coating compositions may comprise either nickel, cobalt or iron base compositions with combinations of these ingredients being suitable but not required. Otherwise, the coating compositions include additions of manganese or of a metal mixture comprising tantalum combined with tungsten or manganese or a combination thereof. Inclusions of a reactive metal and, alternatively, inclusions of silicon, hafnium, rare earth and/or refractory metal oxide particles are preferred. In each instance, the amounts of these ingredients are utilized in the same ranges as expressed relative to the high temperature coatings.

Other uses for the compositions of the invention will be apparent to those skilled in the art, and it will also be appreciated that other alloying elements may be employed in the coatings in accepted amounts and in accordance with known practices.

The utilization of plasma spray techniques to deposit the coating compositions is preferred. The wide differences in the evaporation rate (or vapor pressure) between high vapor pressure elements like manganese or aluminum and low vapor pressure elements like tantalum or tungsten makes the deposition and composition control of this coating by vacuum physical vapor deposition difficult, if not impossible. In addition, compositions in accordance with this invention produce very dense coatings after plasma spraying. It will be appreciated, however, that process improvements or modifications in methods such as physical vapor deposition or ion plating could make coating by these methods possible, and the use of these methods is therefore contemplated. Additionally, techniques like sputtering or slurry sintering may also be considered.

After deposition of the coating, the coated articles preferably are subjected to an elevated temperature treatment in the range of 1900° F. to 2200° F. for a duration of one to 10 hours in an inert atmosphere (for example, in a vacuum or in an argon atmosphere) to promote interfacial bonding.

To illustrate the practice of the invention, a typical nickel-base superalloy of the type used in gas turbine engines, known as IN738, and having a nominal composition of 0.09% C, 16.0% Cr, 8.5% Co, 1.7% Mo, 2.5% W, 1.7% Ta, 3.5% Ti, 3.5% Al, 0.01% B, 0.03% Zr and the balance Ni, was provided as one substrate. A typical cobalt-base superalloy of the type used in gas turbine engines, known as Mar-M509 and having a nominal composition of 0.60% C, 23.4% Cr, 10.0% Ni, 7% W, 3.5% Ta, 0.23% Ti, 0.01% B, 0.45% Zr, 1.5Fe, 0.10% Mn, 0.40% Si and the balance Co, provide a second substrate for testing.

A first series of coatings was produced by plasma spraying prealloyed powders. These powders were sprayed in a plasma arc (>Mach 3 velocity) using argon and helium as primary and secondary gases, respectively. Spraying was performed in a chamber maintained at a dynamic pressure of 55 Torr. The process parameters were:

| | |
|---|---|
| Gun to workpiece distance | 16 in. |
| Primary gas (argon) | 370 CFH at 225 psi |
| Secondary gas (helium) | 150 CFH at 250 psi |
| Voltage | 50–52 volts |
| Current | 1400–1440 amps |
| Powder flow | 0.07 lb./min. |
| Carrier gas (argon) | 25 CFH at 100 psi |
| Time for deposition | 45 sec. |

The articles were then subjected to heat treatment in a vacuum for four hours at 1975° F.

The following table illustrates the compositions, tested and the test results.

TABLE I

PROPERTIES OF MCrAlY COATINGS

| COATING SYSTEM | COMPOSITION (WT %) | | | | | | | | | AVERAGE LIFE[1] (HOURS) | | CRACKING AFTER WATER SPRAY QUENCH TEST | IMPACT ENERGY REQUIRED TO PRODUCE CRACKS[2] OR CHIPS (IN.-LBS.) |
|---|---|---|---|---|---|---|---|---|---|---|---|---|---|
| | Ni | Co | Cr | Al | Ta | Mn | W | La | Y | IN738 SUBSTRATE | MAR-M509 SUBSTRATE | | |
| UTC[3] | | | | | | | | | | | | | |
| NiCoCrAlY | Bal | 23 | 18 | 13 | | | | | 0.3 | 100 | 190 | No | 3.0 |
| MDC-35A | Bal | 15 | 20 | 12 | 2.5 | | | | 0.5 | 107 | | No | 3.0 |

TABLE I-continued
PROPERTIES OF MCrAlY COATINGS

| COATING SYSTEM | COMPOSITION (WT %) | | | | | | | | | AVERAGE LIFE[1] (HOURS) | | CRACKING AFTER WATER SPRAY QUENCH TEST | IMPACT ENERGY REQUIRED TO PRODUCE CRACKS[2] OR CHIPS (IN.-LBS.) |
|---|---|---|---|---|---|---|---|---|---|---|---|---|---|
| | Ni | Co | Cr | Al | Ta | Mn | W | La | Y | IN738 SUBSTRATE | MAR-M509 SUBSTRATE | | |
| MDC-34H | Bal | 10 | 20 | 17 | | | | | 0.6 | 186 | | Yes | 1.0 |
| MDC-1A | Simple Aluminide | | | | | | | | | 23[4] | | Yes | 0.5 |
| LDC-2E | Platinum Aluminide | | | | | | | | | 135 | | Yes | 2.0 |
| MDC-35B | Bal | 15 | 20 | 12 | 2.5 | | | 1.5 | 0.5 | 124 | 237 | No | 3.0 |
| MDC-35C | Bal | 15 | 20 | 12 | | 2.5 | | | 0.5 | 110 | | No | 3.0 |
| MDC-35D | Bal | 15 | 20 | 12 | 2.5 | 2.5 | | | 0.5 | 175 | 238 | No | 2.0–3.0 |
| MDC-35E | Bal | 15 | 20 | 12 | 2.5 | | 1.5 | | 0.5 | 125 | | No | 3.0 |
| MDC-35M | Bal | 21 | 16 | 12 | 2.5 | 1.7 | | | 1.0 | 230 | | No | 3.5–4.0 |

[1] Rig Cycle: 2100° F./2 Min. + 1750° F./4 Min. + 2100° F./2 Min. + Cool/2 Min. (5 ppm salt).
[2] Results obtained from drop weight test.
[3] Composition conforming to United Technologies U.S. Pat. No. 3,928,026.
[4] Result from one test.

A 500X photomicrograph of one of the coatings (MDC-35D) is shown in FIG. 1; the thicknesses of the coatings typically were 0.004 inches, however, it is contemplated that the coating thickness vary between 0.0001 and 0.1 inches. The optical micrograph reveals the presence of a ductile matrix of gamma (Ni, Cr) containing a dispersion of beta (Ni, Co) Al intermetallic compound. The proportion of these two phases was about the same in all the MCrAlY coatings listed in Table I with the exception of MDC-34H; this high Al MCrAlY coating contained more of the beta phase. Electron microprobe analysis showed that the coating chemistry was not very much different from that of the chemistry of the powder.

The performance of the articles coated pursuant to this example was evaluated using a 0.7 Mach burner rig. The testing cycle was 2100° F./2 minutes; 1750° F./4 minutes; 2100° F./2 minutes; air cool/2 minutes. Five (5) ppm salt solution was injected into the combustion products of JP5 fuel containing 0.2% sulfur. This cycle simulates the gas turbine engine environment for turbine blades and vanes, it highlights the oxidation phenomenon, and it imposes significant thermal stresses on the protection system.

It is seen from Table I that coatings produced in accordance with this invention exhibit substantially improved performance compared to a simple MCrAlY type system (UTC NiCoCrAlY, U.S. Pat. No. 3,928,026). In addition, the corrosion resistance of the relatively low aluminum content material is similar to that of a very high aluminum content MCrAlY coating like MDC-34H which had more of the beta phase. A typical high Al content MCrAlY will have good oxidation resistance but poor ductility because of the high amount of beta phase; whereas, a low Al content MCrAlY will have good ductility but relatively poor oxidation resistance. Coatings produced in accordance with this invention demonstrate excellent oxidation resistance and, because of their relatively low aluminum content, exhibit excellent ductility as will be discussed. The coatings also reveal improved oxidation resistance compared to an advanced platinum aluminide coating like LDC-2E, and a simple aluminide coating such as MDC-1A.

The performance of the articles coated pursuant to this example was also evaluated by means of a water spray quench test and drop weight impact testing. The former test is a measure of coating ductility and consists of heating the coated airfoil sections to 2100° F.±100° F. holding the articles at this temperature for time periods of 15 minutes to two hours, and then quenching them in a water spray. It is to be noted that the thermal strains that are generated in this type of test are less severe than those which may be encountered in advanced air-cooled aircraft engine gas turbine blades and may be similar to those experienced in other types of gas turbine blades. The latter test is also a measure of coating ductility, high-lighting the handling characteristics of the coated parts. It consists of dropping a one-pound indentor from several heights onto the trailing edge of a coated airfoil section with the energy of impact being equal to the height in terms of inch-lbs. The tested specimens are evaluated, using a stereo microscope at 20X magnification, for appearance of defects (chips and cracks). The energy of impact necessary to produce cracks or ships on the trailing edges is taken as a measure of coating ductility. The higher this energy, the greater the coating ductility.

The results from these two tests are also shown in Table I. It is seen that articles coated pursuant to this example do not show any cracks after the water spray quench test unlike the high Al MCrAlY or the aluminides thereby confirming the ductility of coatings in accordance with this invention. Drop weight tests done on the trailing edges of coated airfoil sections indicate that articles coated pursuant to this example are able to withstand greater impact energy than high Al MCrAlY or aluminide coated articles. This also confirms that coatings in accordance with this patent are ductile.

The Table also illustrates the value of the use of the metal mixture of the invention. Thus, MDC-35A contains only tantalum and MDC-35C contains only manganese, while MDC-35B, D, E and M contain the mixture. While MDC-35A and MDC-35C demonstrate a modest life increase, the most significant improvement in coating life is exhibited by the mixture.

As indicated, the foregoing series of coatings illustrate the application of the invention for high temperature operations. A second series of coatings was developed for purposes of illustrating the application of the invention to intermediate temperature applications. The IN738 and MAR-M509 substrates previously referred to were also used in association with these coatings. The coatings were plasma sprayed onto the substrates in accordance with the parameters previously described and the same heat treatment in a vacuum for four hours at 1975° F. was utilized.

Figure 2:
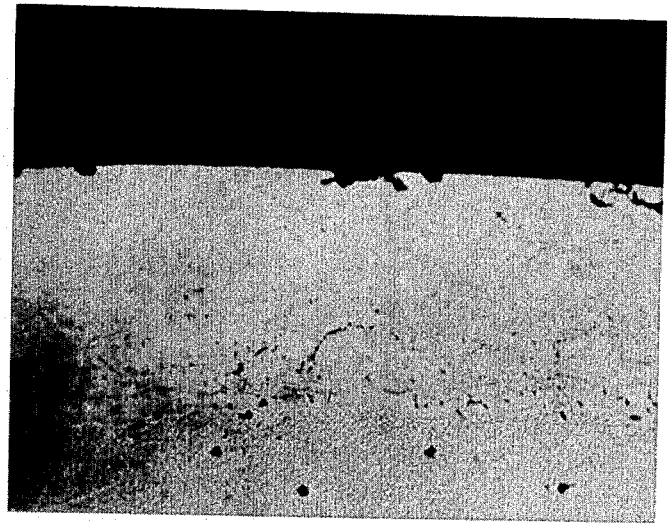
FIG. 2 comprises a 500X magnification of the microstructure of a coating and substrate particularly suited for performance at low temperatures.
Figure 4:
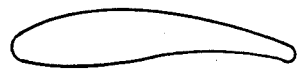

A 500X photomicrograph of one of the coatings (MDC-36D) is shown in FIG. 2. The thickness of the coatings typically was between 0.004 to 0.006 inches, and it is contemplated that the coating thickness vary between 0.0001 and 0.1 inches. Electron microprobe analysis revealed that the coating chemistry is substantially the same as that of the powder.

Figure 3:
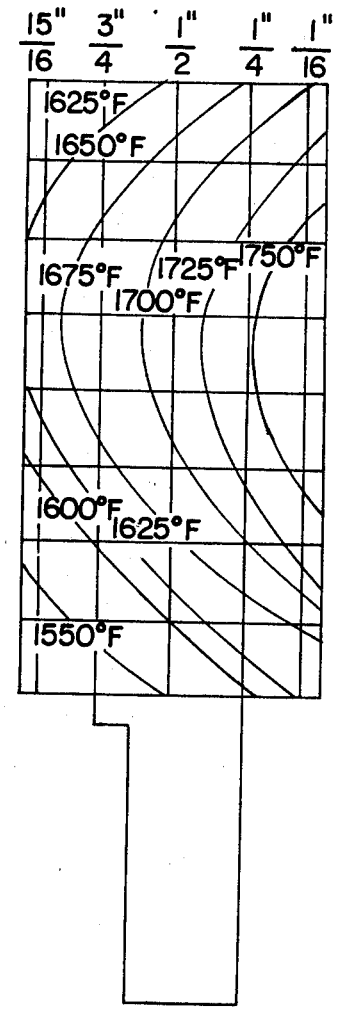
FIG. 3 is a plan view of a test specimen having temperature profiles superimposed thereon; and, FIG. 4 is an end view of the test specimens.

The performance of the articles coated pursuant to this example was evaluated using a 0.7 Mach burner rig. The testing cycle was 1750° F./2 minutes; 1450° F./4 minutes; 1750° F./2 minutes; air cool/2 minutes. As shown in FIG. 3, the peak temperature of 1750° F. generated a spectrum of temperatures in the paddle test specimen, there being a variation of about 200° F. (1550° F. to 1750° F.) over the entire surface of the specimen. The same variation and isotherm pattern developed at the lower end of the cycle (1450° F.), and the coatings that were tested were therefore exposed to temperatures from 1250° F. to 1750° F. This is one of the conditions necessary for the aforementioned corrosion to take place, and the other conditions were created by adjusting the sulfur content in the fuel and by injecting salt solution into the combustion products. The fuel used was JP5 doped with ditertiary butyl disulfide to obtain 0.3% sulfur; and fifty (50) ppm salt was injected into the combustion products. This cycle simulates the gas turbine engine environment for turbine blades and vanes and highlights the sulfidation (hot corrosion) phenomenon while imposing significant thermal stresses on the protection system.

The results of this testing including some interim (ongoing) evaluations, are shown in Table II:

layer of carbide (probably $M_{23}C_6$) at the interface. The tendency of this carbide formation was reduced by increasing the amount of Co in the coating. Coatings on Ni-base alloys were free of carbide formation.

Specimen MDC-35C illustrates that, under the test conditions, manganese without the presence of either tantalum or tungsten will impart excellent sulfidation resistance to an MCrAl base overlay coating. When compared with specimens MDC-35D and MDC-35M, it will be apparent that at these temperature levels, the mixture of this invention which includes tantalum is also highly effective.

The performance of the articles coated pursuant to this example was also evaluated by means of water spray quench testing and drop weight impact testing of the types previously described. Coating ductility is important for gas turbine engine applications to ensure that the mechanical properties of the substrate alloy are not compromised.

The results from the first test showed that articles coated pursuant to this example do not show any cracks after the water spray quench test unlike the UTC CoCrAlY coating, thereby showing that these coatings are ductile. Drop weight tests done on the trailing edges of coated airfoil sections also indicate that articles coated pursuant to this example are able to withstand greater impact energy than the UTC CoCrAlY coating. This also confirms that coatings in accordance with this concept are ductile.

The coating compositions falling within the scope of this invention are suitable for a wide variety of superalloy substrates, and the particular examples of substrates

TABLE II
INTERMEDIATE TEMPERATURE BURNER RIG TEST RESULTS

| COATING SYSTEM[1] | COMPOSITION (WT %) | | | | | | | | AVERAGE LIFE[2] (HRS.) |
|---|---|---|---|---|---|---|---|---|---|
| | Ni | Co | Cr | Al | Ti | Ta | Mn | La | Y | |
| UTC CoCrAlY[3] | | Bal | 23 | 13 | | | | | 0.6 | 912 |
| GE CoCrAlY[4] | | Bal | 29 | 6 | | | | | 1.0 | 1020 |
| MDC-34U | 29 | Bal | 26 | 6 | | | | | 0.6 | 936 |
| MDC-34Y | Bal | 10 | 20 | 6 | | | | | 0.6 | 1445 |
| MDC-36D | | Bal | 30 | 9 | | 2.5 | 1.7 | 1.0 | | 1500 ↑[5] |
| MDC-36E | Bal | 5 | 30 | 8 | 2.0 | 2.5 | 1.7 | 1.0 | | 2250 ↑[5] |
| MDC-35D | Bal | 15 | 20 | 12 | | 2.5 | 2.5 | 0.5 | | 4800 ↑[5] |
| MDC-35C | Bal | 15 | 20 | 12 | | | 2.5 | 0.5 | | 3400 ↑[5] |
| MDC-35M | Bal | 21 | 16 | 12 | | 2.5 | 1.7 | 1.0 | | 3700 ↑[5] |

[1]Includes both IN738 and MAR-M509 substrates
[2]Rig cycle: 1750° F./2 min + 1450° F./4 min + 1750° F./2 min + cool/2 min (50 ppm salt)
[3]Composition conforming to United Technologies' U.S. Pat. No. 3,676,085
[4]Composition conforming to General Electric Co. U.S. Pat. No. 4,101,715
[5] ↑ denotes "not yet failed"

The term "average life" mentioned in the above refers to the approximate number of hours of test prior to the formation of an observable substrate metal oxide (which indicates that the coating has been penetrated under the burner rig test conditions) anywhere on the paddle specimen. It is seen that coatings produced in accordance with this invention unexpectedly exhibit substantially improved sulfidation resistance performance compared to a simple MCrAlY system such as the CoCrAlY of U.S. Pat. No. 3,676,085, or the CoCrAlY specimen of U.S. Pat. No. 4,101,715.

With respect to the high chromium compositions of Table II, the test revealed that additions of Ta, Mn and Ti improve the corrosion resistance in a fashion similar to the improvements observed in Table I. Although the performance of these high Cr compositions was the same on both IN738 and MAR-M509 alloys, the microstructures were different. High Cr coating compositions on cobalt-base substrates tended to form a continuous referred to herein are not to be considered limiting. Thus, any substrate which can be satisfactorily coated with the composition of this invention by means of plasma spraying or any other suitable coating technique, and which will retain the coating in a satisfactory manner where elevated temperature performance is contemplated, will be suitable.

Coating compositions falling within the broader ranges expressed herein are generally useful for applications where sulfidation and/or oxidation resistance is desired. As explained, applicants have also discovered that certain more limited ranges within the broad ranges provide particularly suitable performance for sulfidation-prone applications, and other more limited ranges provide more suitable performance in oxidation-prone applications. The following claims are presented with this general understanding in mind.

It will be understood that various changes and modifications not specifically referred to herein may be made in the invention described without departing from the spirit of the invention particularly as defined in the following claims.

We claim:

1. In a superalloy component, the improvement comprising a coating composition on said component consisting essentially by weight of from 5 to 35% cobalt, 10 to 35% chromium, 5 to 15% aluminum, 0.1 to 10% manganese, up to 8% tantalum, up to 5% tungsten, up to 12% silicon, up to 10% hafnium, and the balance nickel.

2. In a superalloy component, the improvement comprising a coating composition on said component consisting essentially by weight of from 15 to 40% chromium, 3 to 13% aluminum, 0.1 to 10% manganese, up to 5% tantalum, up to 2% tungsten, up to 12% silicon, up to 10% hafnium, and the balance cobalt.

3. A component in accordance with claim 1 wherein said coating includes from 10 to 20% by weight cobalt, from 15 to 25% by weight chromium, and from 10 to 14% by weight aluminum.

4. A component in accordance with claims 1 or 2 wherein said coating includes up to 5% by weight of a reactive metal selected from the group consisting of lanthanum, yttrium, and the other rare earths.

5. A component in accordance with claim 4 wherein said reactive metal is present in an amount between 1 and 3% by weight of the composition.

6. A component in accordance with claims 1 or 2, wherein said coating includes up to 5% by weight of a member selected from the group consisting of rare earth oxide particles and refractory metal oxide particles.

7. A component in accordance with claim 6 wherein said oxide particles are present in an amount between 0.05 and 2.0% by weight.

8. A component in accordance with claims 1 or 2 wherein the tantalum is present in an amount between 2.0 and 5.0% by weight, and including from 2.0 to 5.0% by weight of tungsten and/or manganese.

9. A component in accordance with claim 8 wherein the amount of tungsten does not exceed 1.5% by weight of the coating.

10. A component in accordance with claims 1 or 2 wherein said coating includes from about 0.05 up to about 15% by weight of a noble metal selected from the group consisting of platinum, rhodium or palladium.

11. A component according to claims 1 or 2 wherein said coating is present in a thickness between 0.0001 and 0.1 inches.

12. A component in accordance with claims 1 or 2 including a superalloy substrate, and at least two coating layers applied to said substrate, said composition comprising either or both of said layers.

13. A component according to claims 1 or 2 wherein said coating comprises the bond coat for a thermal barrier coating.

14. A component according to claims 1 or 2 wherein said coating is deposited by plasma spraying.

15. A component in accordance with claims 1 or 2 wherein said manganese is present in amounts between 1 and 4%.

16. A component according to claims 1 or 2 wherein said component is a component of a gas turbine engine.

* * * * *